United States Patent [19]

George et al.

[11] 4,079,461
[45] Mar. 14, 1978

[54] GAP TOLERANT BUBBLE DOMAIN PROPAGATION CIRCUITS

[75] Inventors: Peter K. George, Placentia; Isoris S. Gergis, Yorba Linda; Tsutomu Kobayashi, Placentia, all of Calif.

[73] Assignee: Rockwell International Corporation, El Segundo, Calif.

[21] Appl. No.: 709,986

[22] Filed: Jul. 30, 1976

[51] Int. Cl.² ............................................. G11C 19/08
[52] U.S. Cl. ........................................ 365/39; 365/12; 365/15; 365/29
[58] Field of Search .................................. 340/174 TF

[56] References Cited

U.S. PATENT DOCUMENTS

| | | | |
|---|---|---|---|
| 3,838,406 | 9/1974 | Cohen et al. | 340/174 TF |
| 3,990,058 | 11/1976 | Archer et al. | 340/174 TF |
| 4,007,453 | 2/1977 | Bonyhard et al. | 340/174 TF |

*Primary Examiner*—James W. Moffitt
*Attorney, Agent, or Firm*—H. Fredrick Hamann; G. Donald Weber, Jr.

[57] ABSTRACT

There is disclosed an improved circuit element or structure for use in propagation of magnetic bubble domains. The improved circuit element permits a more desirable gap-to-period ratio than conventional element patterns. The improved circuit element provides portions thereof which are substantially parallel to similar portions of adjacent, similar circuit elements. As a consequence, the magnetic poles developed in the adjacent circuit elements by the application of the in-plane magnetic field are substantially identical at a given time thus facilitating interelement transfer.

The circuit element structures are arranged in various propagation paths and operational components. Propagation paths and inter-propagation path elements are described.

21 Claims, 9 Drawing Figures

GAP TOLERANT BUBBLE DOMAIN PROPAGATION CIRCUITS

BACKGROUND

1. Field of the Invention

This invention relates to magnetic bubble domain devices, in general, and to an improved magnetic bubble domain propagation circuit element, in particular.

2. Prior Art

Many uses and applications of magnetic bubble domains, especially in large mass memory devices have been set forth recently. Improved devices or circuit elements, which have been suggested for magnetic bubble domain systems, have evolved through time. The materials which have been developed and utilized have improved wherein smaller diameter bubbles are useful. In addition, mobility and other characteristics of bubbles have been improved. Therefore, some of the limitations on the bubbles have been the field which has been required to produce propagation and the dimensions of the devices. To some extent, the dimensions in the devices have been limited by the manufacturing techniques such as fine-line lithography and the like. In addition, the dimensions of the devices have been affected by the type of device utilized.

More recently, the propagation devices have been in the form of T-bar, H-bar, or chevron components. Of course, modifications of the T and H bars (for example bent H bars) have been utilized. Nevertheless, in each of these known propagation devices, magnetic poles are formed at the ends of the respective components in response to a rotating in-plane drive field $H_R$. As the rotating field changes position, the magnetic poles at the ends of the adjacent components such as the T-bar and the I-bar vary wherein bubbles are attracted to some poles and repelled from other poles. Nevertheless, it is readily apparent that the ends of the devices are disposed at an angle with respect to each other. In this case, the bubble must then be driven from one device to the adjacent device in order to promote bubble propagation.

It has been noted that in field access devices, such as those described supra, the drive field must be above a certain minimum value determined by the magnetization and geometry of the propagation structure and other factors. In addition to the garnet coercivity and the viscous damping, the energy barriers presented to the bubble as a result of the non-uniformity in the static energy coupling between that bubble and the overlying permalloy pattern must be overcome as well. The energy barrier is, at least partially, due to the polarization of the overlying permalloy pattern by the stray field produced by the magnetic bubble. One attempt to overcome this effect is described in the copending application of P. K. George entitled Magnetic Bubble Domain Composite Including a Field Shunt, filed Dec. 14, 1973, Ser. No. 425,058, now U.S. Pat. No. 4,006,276 and assigned to the common assignee. However, in known devices the external, rotating, in-plane field $H_R$ produces additional polarization of the permalloy overlay which creates the drive field which is responsible for bubble propagation. Typically, the static energy coupling profile between the bubble and the pattern varies by less than 10% for points underneath the permalloy elements. However, this coupling falls off very rapidly outside the periphery of the permalloy element. The fall-off distance is on the order of a bubble diameter in most cases.

The static energy profile of a propagation pattern is the superposition of the profiles of discrete elements wherein the energy barrier height depends on the degree of overlap between the energy profiles of the adjacent elements. The ratio of bubble-diameter-to-gap-width determines the height of the energy barrier associated with the air element gaps. Thus, the larger the ratio the smaller the barrier height.

In the present state of the art, propagation patterns such as the T-I or T-X circuits, a bubble-diameter-to-gap ratio of about 3 to 1 is required. The device-period-to-gap ratio is approximately 16 to 1. Consequently, the gap is the smallest feature in the propagation circuit. It is noted that the device-bit-density per unit area which is equal to the inverse of the square of device period is determined by the gap width which is further determined by the resolution of the lithographic process. Thus, if the gaps can be made smaller, density can be increased. However, for a given lithographic resolution, a substantial increase in the device bit density can be obtained if the device-period-to-gap ratio is decreased.

Moreover, as bubble diameters decrease, other difficulties are encountered in current T-I and T-X devices. Using the T-I bar pattern as illustrative, because of the approximate orthogonal relationship of adjacent permalloy patterns and, thus, poles, the difficulty is readily observed. As the in-plane field rotates, the poles change as well. Thus, the pole at which the bubble is instantaneously located becomes less attractive and the pole at the adjacent device becomes more attractive. However, the bubble will not move from the first pole to the second pole until the effect on the bubble overcomes the field gradient associated with the energy barrier between the elements. In addition, before the bubble crosses the gap, it is subjected to increasingly higher effective bias field and as a result suffers shrinkage in size. As the bubble diameter becomes smaller, the effective energy barrier becomes higher thereby making it more difficult for the bubble to cross the gap. This effect which becomes worse at higher bias field (hence smaller bubble size) causes the propagation margin to be very sensitive to the bubble-to-gap ratio.

SUMMARY OF THE INVENTION

The invention is directed to a gap tolerant magnetic bubble domain circuit. The gap tolerant circuit design is based largely upon the fact that the gap is located between essentially parallel poles. That is, the propagation device includes end portions thereof which are arranged so that adjacent circuit elements include substantially parallel portions wherein consecutive poles are essentially parallel and exhibit the same magnetic pole alignment. The magnetic circuit elements include, between the end portions which permit the parallel poles, one or more segments of magnetic material which interconnect the end portions. The intermediate or connecting member (or members) are generally larger than the end portions and have peripheral edges which facilitate bubble domain movement relative thereto.

DESCRIPTION OF THE PREFERRED EMBODIMENT

Figure 1:
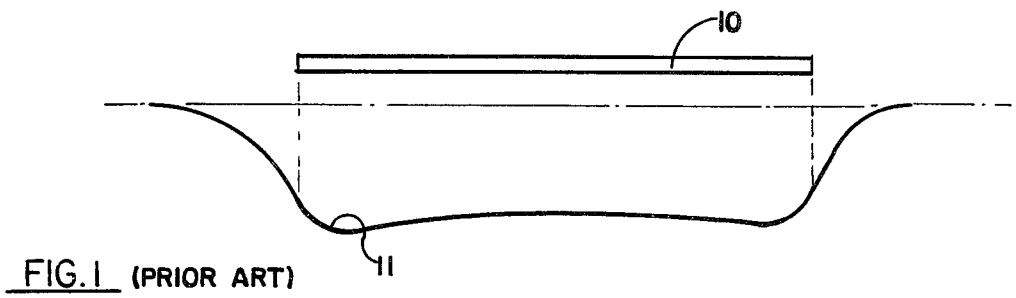
FIG. 1 is an energy profile for a single magnetic element, known in the art.

Referring now to FIG. 1, there is shown a typical static coupling energy profile 11 underneath a discrete permalloy bar 10 (shown in side view). Profile 11 represents the magnetostatic energy coupling of the magnetic bubble domain (not shown) as a result of the magnetic field produced by a magnetic bubble in the bubble domain material. It is seen that the static energy coupling profile varies by about 10% or less directly underneath the discrete permalloy element. However, the profile falls off rapidly in the area beyond the perimeter of the element. It has been shown that the fall off distance is on the order of the diameter of a magnetic bubble domain.

Figure 2:
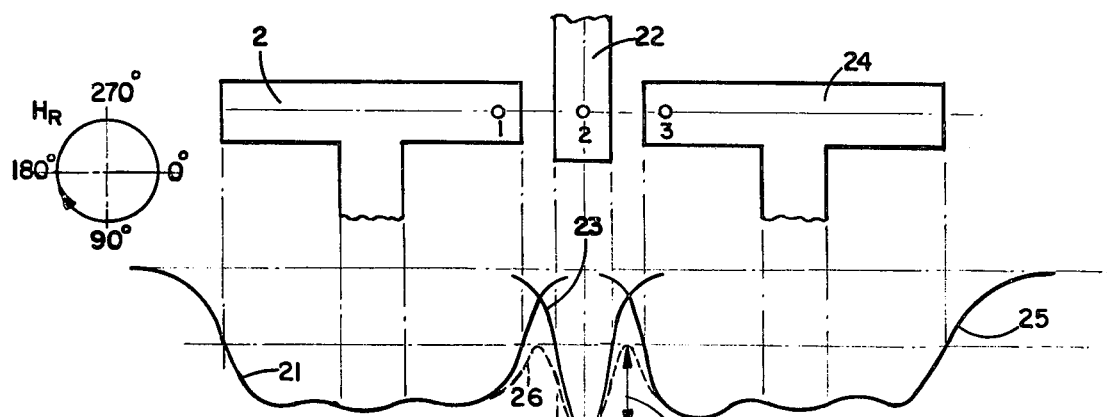
FIG. 2 is a composite energy profile for a plurality of adjacent magnetic elements, known in the art.

Referring now to FIG. 2, there is shown a typical static energy profile of a T-I pattern (shown in top view). The static energy profile of this propagation pattern is a result of the superposition of the profiles of the discrete elements comprising T-bars 20 and 24 as well as I-bar 22. Thus, profiles 21 and 25 represent the static energy coupling profiles for T-bars 20 and 24, respectively. In addition, profile 23 is the profile for I-bar 22. Resulting profile 26, shown in dashed line 26, represents the superposition or overlapping of the energy profiles of adjacent elements. Profile 26 represents the energy barrier height $E_{BH}$ in the gap between the adjacent elements. The energy barrier height is known to be a function of the diameter-to-gap ratio. Thus, the larger this ratio, the smaller the magnitude of $E_{BH}$.

In order to move a bubble from location 1 at T-bar 20 to location 2 on I-bar 22, it is typically necessary to have the rotating field $H_R$ rotate approximately 90° in the clockwise direction for this embodiment. As field $H_R$ rotates from the 0° to the 90° position, the pole at location 1 becomes less attractive and the magnetic pole at location 2 becomes more attractive. However, the bubble will not move from location 1 to location 2 until the bubble overcomes the field gradient associated with the energy barrier represented by profile 26. In addition, before the bubble crosses the gap between elements 20 and 22, the bubble is subjected to an increasingly higher effective bias field $H_B$ and suffers a shrinkage in diameter. As the bubble diameter becomes smaller, the effective energy barrier becomes higher. Thus, it is more difficult for the bubble to cross the gap. This has a direct relationship upon the system and device margin as well as other propagation parameters. Moreover, if larger fields are applied to the device in an attempt to improve bubble velocity or margin, the reverse effect is frequently produced. That is, excessive fields may reduce the size of the bubble until annihilation is effected. Likewise, to move a bubble from location 2 to location 3, the field, $H_R$, must rotate from the 90° to the 180° The same (or similar) energy barrier considerations apply.

Figure 3:
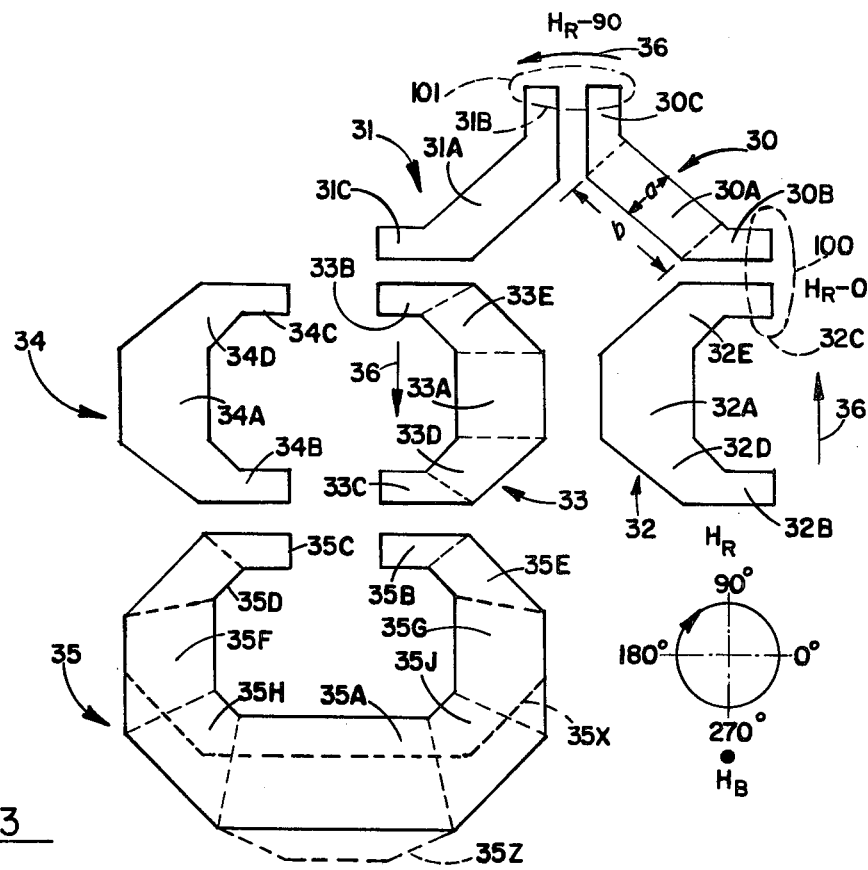
FIG. 3 is a schematic diagram of the magnetic elements having end portions which are arranged to be parallel in accordance with the instant invention.

Referring to FIG. 3, there is shown a representative propagation path which includes a plurality of new and unique propagation elements of the instant invention. The symmetrical propagation elements 30, 31, 32, 33, 34 and 35 represent an illustrative propagation path. In addition, it is seen that at least three different, but related, propagation elements are represented. The basic propagation element is represented by elements 32, 33 and 34. Elements 30 and 31 are referred to as the $3\pi/2$ elements while element 35 is referred to as the $3\pi$ element. While elements 32–34 are referred to as the standard elements, the basic element is the $3\pi/2$ element such as elements 30 and 31. Each of elements 30 and 31 is comprised of three element portions all of which are, typically, integral and joined together. In particular, element 30 comprises base or interconnection portion 30A and end portions 30B and 30C which are joined to base portion component 30A. Portions 30B and 30C project from portion 30A at an angle of approximately 135° so that the desired relationship between elements 30 or 31 and other elements is established. That is, end portions 30B or 30C are arranged to be in parallel with adjacent end portions such as 31B, 32B, 33B and the like.

In the preferred embodiment, the end portions 30B and 30C are generally narrower than interconnecting portion 30A and the width thereof is represented by dimension $a$. In addition, the end portions 30B and 30C are typically shorter in the $b$ dimension than element 30A. Moreover, in a preferred embodiment, the edges of element 30A are substantially parallel as are the edges of elements 30B and 30C, respectively. These relationships provide greater design ease and freedom as well as improving the magnetic operating characteristics of the device.

It is seen that elements 32, 33 and 34 are substantially similar to element 30 in most respects. That is, standard element 33 includes interconnecting portion 33A and end portions 33B and 33C which have the same general relationships as indicated in element 30 except for the relative angle between the end portions and the interconnecting portions. However, element 33 includes coupling portions 33D and 33E which are inserted between interconnecting portion 33A and respective end portions 33B and 33C. The coupling portions typically are angulated relative to the interconnecting portion by approximately 135° while the end portions are angulated relative to the coupling portions by the same angle. Consequently, a net angulation between the end portions and the interconnecting portions is substantially 90°. Thus, it is possible to arrange a plurality of elements such as 32, 33 or 34 in series to provide propagation which would be equivalent to the elongated path of chevrons, T-bars, I-bars or the like. However, in this arrangement, end portions 33B, 33C of respective adjacent elements are positioned in parallel. Thus, the advantages which have been noted are provided. Moreover, as indicated in FIG. 3, by appropriate utilization of standard elements such as 32 and 33 as well as basic elements 30 and 31, an outisde corner of a propagation path may be achieved to permit desired path configurations.

Element 35, the $3\pi$ element, permits the same structural advantages with only minor modifications to elements 33. For example, element portions 35F and 35G as well as 35H and 35J are inserted as additional coupling elements between existing coupling elements 35D and 35E and base portion 35A. With the appropriate element angulation, the end elements 35B and 35C are effectively pointed toward each other (although in opposite directions). Thus, by using the basic design criteria noted relative to element 30, an inside corner element is provided. Again, this corner element is adapted for connection with the remainder of the propagation path such as elements 30 through 34 in a suitable relationship.

In one embodiment, element portion 35Z (see dashed outline) may be included at the outer edger of element portion 35A to provide an additional number of acute angle corners around the periphery of the device in order to facilitate the propagation of the bubble domain therearound in response to the rotating field. In the alternative, element 35 may be modified as suggested by dashed outline 35X. In this embodiment, portions 35A, 35H and 35J may be reduced in width to provide improved operation.

The basic device structure has been described. The advantages of these device structures is suggested by the arrangement of bubbles 100, 101 shown in dashed outline. That is, assume a bubble at the end of end portion 32B of element 32. As field $H_R$ rotates in the counterclockwise direction, the bubble moves toward the junction between end portion 32B and coupling portion 32D. From hence the bubble moves toward interconnecting portion 32A and coupling portion 32E, sequentially. Ultimately, when field $H_R$ reaches the 0° position, the bubble will have traversed element 32 and be attracted to a strong magnetic pole at the end of end portion 32C. Concurrently, end portion 30B also exhibits a strong magnetic pole because of the in-plane field $H_R$. Consequently, the bubble at end 32C strips out and rests at the end of end portion 30B concurrently.

In the known manner, when field $H_R$ rotates, the bubble at end portion 30B traverses the periphery of element 30. That is, the bubble traverses the periphery of element portion 30A and reaches end portion 30C. At that point, portion 31B also exhibits a strong magnetic pole wherein the bubble, such as bubble element 101, strips out and resides at both end portions concurrently. By similar action, the bubble will then also traverse elements 31, 32, 33 and 34 (and so forth) sequentially. The significant advantage which is achieved is that the gap between adjacent elements is of little or no consequences. The energy barrier of a gap is significantly overcome in terms of bubble propagation inasmuch as each of the adjacent, parallel portions exhibits the same magnetic pole-rather than magnetic poles which are 90° apart as is the case in the standard T-I bar arrangements.

Figure 4:
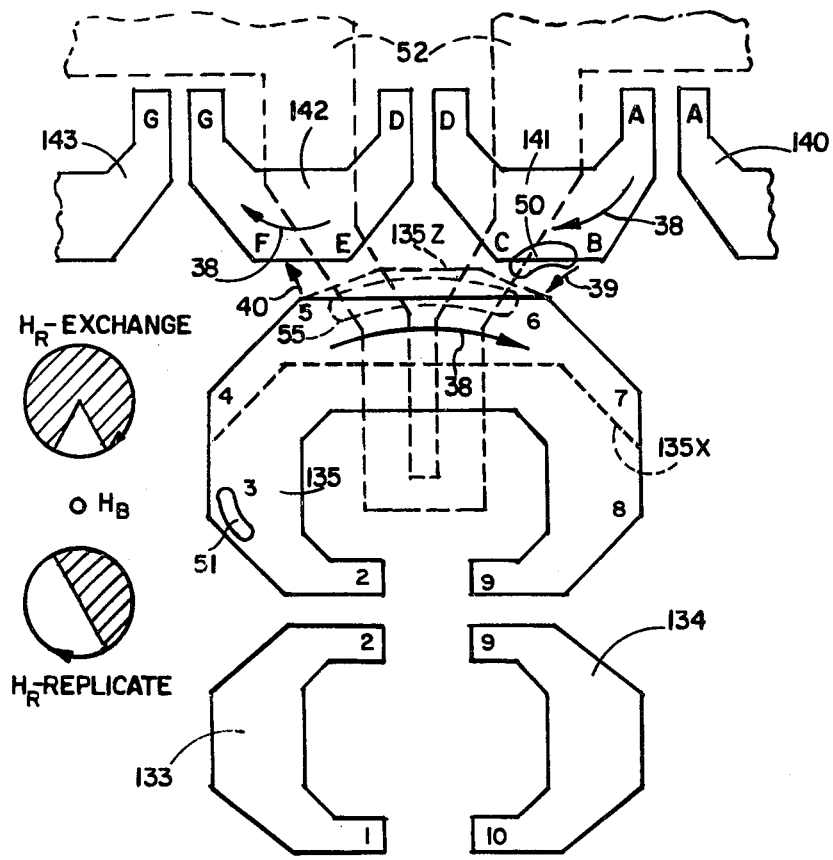
FIG. 4 is a diagram of one application of the elements shown in FIG. 3 which are arranged to form an exchange/replicate switch.

Referring now to FIG. 4, there is shown a replicate/exchange switch which can be fabricated using the devices or elements described supra. Replicate/exchange switches known in the art are described in copending applications 75E137 entitled Compact Exchange Switch for Bubble Domain Devices, by Thomas T. Chen et al, filed on May 21, 1976, bearing Ser. No. 688,652, entitled Data Processing Switch, by Thomas T. Chen, filed on May 21, 1976, bearing Ser. No. 688,651, both assigned to the common assignee. In addition, a replicate switch design is described in P. I. Bonyhard et al, A.I.P. Conference Proceedings, NO. 18, Part I, Page 100 (1973). However, the replicate exchange switch shown and described relative to the FIG. 4 is of a unique design. Elements 140 through 143 are the standard elements such as element 34 of FIG. 3. Likewise, elements 133 and 134 are standard elements. Element 135 is a $3\pi$ element such as element 35 in FIG. 3. As shown in FIG. 4, the long edge of element 135 spans the gap between elements 141 and 142, for example. In the absence of a switching current in conductor 52, the bubbles propagate through the respective propagation paths as suggested by arrows 38. Thus, a bubble propagates from element 140 to element 143 following the path A, B, C, D, E, F, G and so forth. Likewise, a bubble propagates through the path comprising elements 133, 134 and 135 which may, in effect, represent a minor loop. In this case, the bubble propagates through locations 1, 2, 3, 4, 5, 6, 7, 8, 9, 10 and so forth.

If now a switching curret is applied to conductor 52, relative to rotating field $H_R$ as shown in the "$H_R$-EXCHANGE" graphic legend, an exchange process will take place. That is, bubbles 51 and 50 propagate along the paths described supra. However, when bubble 50 approaches location C in element 141, the bubble is effectively blocked by the magnetic field produced in conductor 52. The bubble, as suggested by bubble 50, will strip out and extend along the outer edge of conductor 52 until it eventually reaches location 6 in element 135. Thus, bubble 50 will follow the path A, B, 6, 7, and so forth. Likewise, in response to the rotating field, bubble 51 will follow the path 3, 4, 5, F, G. That is, bubble 51 is effectively blocked by a magnetic field produced in conductor 52 and transferred to element 142. Thus, it is seen that a bubble in the loop is exchanged for a bubble in the major path.

If, on the other hand, a replicate operation is desired, the switching current in conductor 52 is applied, relative to the rotating field, as shown in the "$H_R$-REPLICATE" legend. Thus, in this arrangement, it is assumed that no bubble is propagating in the major path comprising elements 140 through 143. However, bubble 51 is propagating through the loop path. When the bubble propagates to the position suggested by bubble 55 (in dashed outline) the bubble is stripped along the periphery of element 135. When the bubble is stripped or extended between locations 5 and 6 on element 135 the switching current is applied. The switching current provides magnetic fields which effectively cut the bubble in two by the repulsive field inside the hairpin loop of conductor 52. The leading portion of the bubble continues in the minor loop, while the trailing bubble transfers to the major path as suggested by arrow 40 in conjunction with the discussion of the exchange mode of operation.

Figure 5:
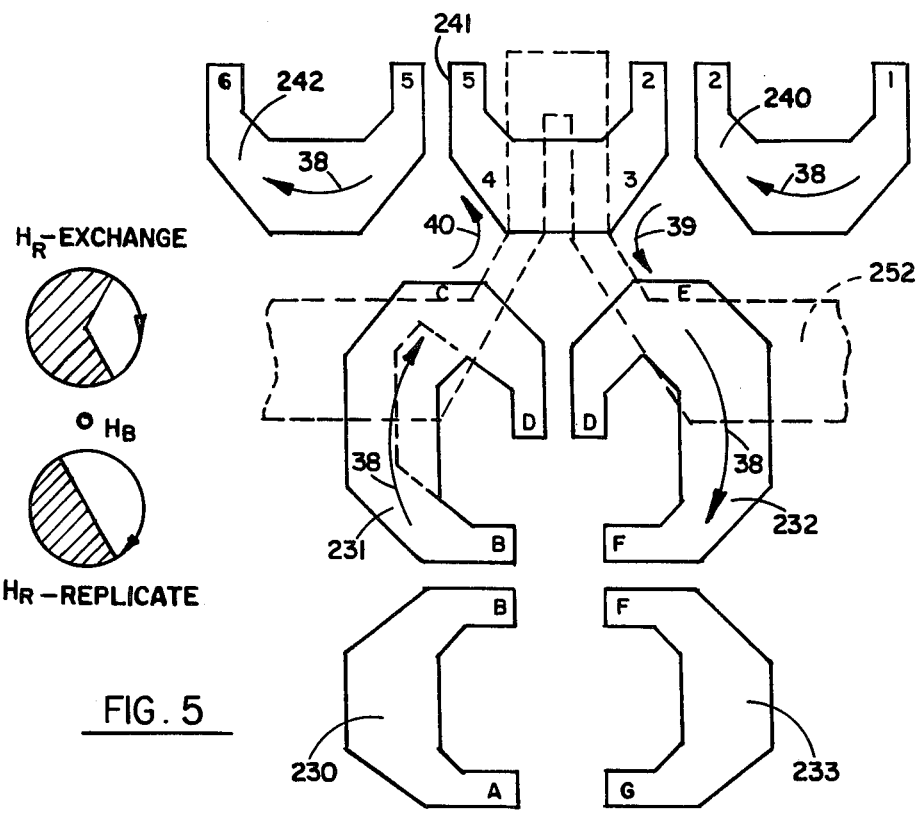
FIG. 5 is another embodiment of an exchange/replicate switch.

Referring now to FIG. 5, there is shown another embodiment of the replicate/exchange switch using the gap tolerant propagation paths described supra. In this illustration, elements 240, 241, 242, 233 and 230 are basically the same as elements 33 and 34 to FIG. 1. However, elements 231 and 232 are hybrid elements or modified versions of either elements 33 or 35. That is, elements 231 and 232 are not the U or C shaped configuration of elements 33 and 34. Nor are these elements of the closed C shaped configuration of element 35. However, the similarity in that the end portions thereof are arranged for parallel positioning relative to adjacent end portions is preserved.

The operation of the switch in FIG. 5 is similar to the operation of the switch in FIG. 4 in that a bubble propagates through the major loop comprising elements 240–242 or through the minor loop comprising elements 231–233 as suggested by arrows 38. In the exchange mode, the bubbles will transfer between the respective loops via paths suggested by arrows 39 and 40, respectively. These bubbles will be transferred (exchanged)

when a switching current is applied to conductor 252 as discussed supra and as suggested in the graphic legend. Likewise, in the replicate mode when a bubble is stretched along the periphery of element 241 between locations 3 and 4, the applications of a switching current will cause the bubble to split. At this point, the leading bubble will continue along the path comprising locations 4, 5, 6 and so forth. The trailing edge of the bubble will transfer from location 3 to locations E, F and so forth as suggested by arrow 39.

Thus, in FIGS. 4 and 5 there are shown switch structures for exchanging bubbles between a major and a minor loop. In addition, in FIG. 4 there is shown a structure for replicating a bubble from a minor loop to a major loop. In FIG. 5, there is shown a structure for replicating a bubble from a major loop to a minor loop. In each of these switch structures, propagation elements include end portions which are substantially parallel to the end portions of adjacent elements. As a result, the gap energy barrier is reduced wherein these structures are gap tolerant propagation path structures.

Figure 6:
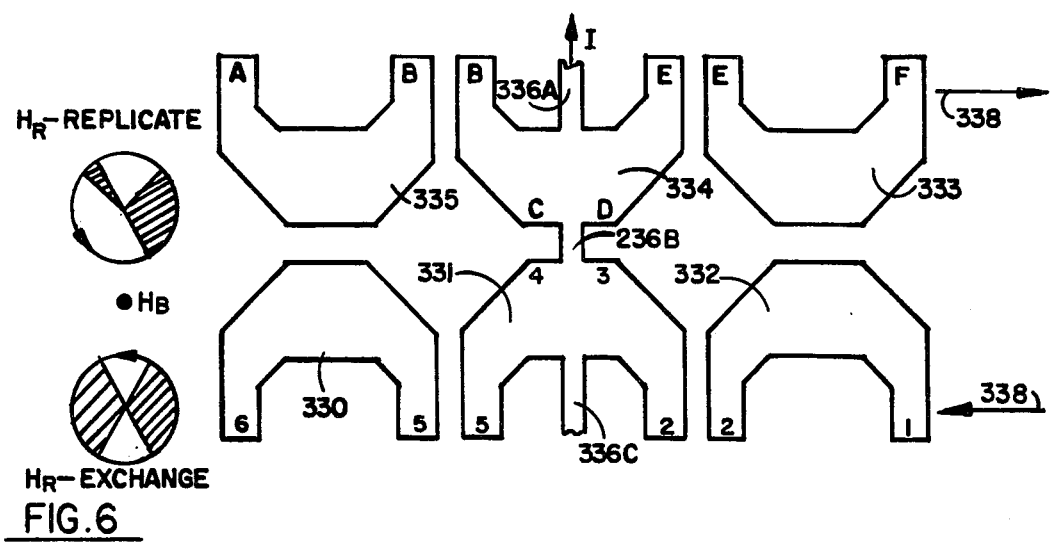
FIG. 6, 7, 8 and 8a are further embodiments of propagation structures in accordance with the instant invention, arranged to produce a transfer switch function.

Referring now to FIG. 6, there is shown an embodiment of a transfer/replicate switch. This switch is analogous to the transfer/replicate switch described by Nelson in connection with multiple chevrons. Reference is made to "Progress in All Permalloy Control Functions", AIP Conf. Proc., Vol. 18, pp 95–99, (1973). In the embodiment shown in FIG. 6, a plurality of C-shaped, gap tolerant structures are arranged in two adjacent paths. The paths may represent essentially parallel propagation paths or a major/minor loop arrangement. In the absence of a switching current signal in the conductor which comprises sections 336A, 336B, and 336C, the bubbles propagate through the propagation path in the directions indicated by arrows 338. Thus, bubbles propagating in elements 330, 331, 332 follow location path 1, 2, 3, 4, 5, 6 and so forth. Likewise, bubbles in the path comprising elements 333, 334, 335 follow the location path A, B, C, D, E, F and so forth.

When the switch is in the transfer mode, current is applied to conductor 336 as suggested by the arrow I during the portion of the rotating field cycle indicated in the legend. In this case, the bubble propagates along the path 1, 2, 3. When the bubble reaches location 3, the field produced by the application of the switching current blocks the bubble and causes it to strip-out from location 3 in element 331 to location D in element 334. As field $H_R$ continues to rotate, the bubble propagates to locations E and F sequentially. Thus, the bubble has been transferred from one path to the other.

In the replicate mode, the bubble is initially assumed to propagate along path 1, 2, 3 and so forth. In this instance, the current is applied to conductor 336 after the bubble has reached location 4, under the influence of rotating field $H_R$ and is moving towards location 5. The application of the current signal produces a magnetic field which causes the bubble to strip out toward location D. Under the influence of rotating field $H_R$, the bubble will continue to stretch between the elements in each of the paths. After the bubble has stretched out between the elements and is respectively stretched between locations 5 and D, an additional switching current signal, in the opposite direction, is supplied to conductor 336. This second switching current signal has the effect of cutting or severing the elongated bubble into two bubble portions. The first portion continues to propagate along the path comprising locations 5, 6 and the like while the new or severed portion follows the path comprising locations D, E, F and the like. This arrangement operates in a fashion similar to the operation of the device described in the Nelson article. However, this switch incorporates the improved gap tolerant propagation element structure shown and described supra.

Figure 7:
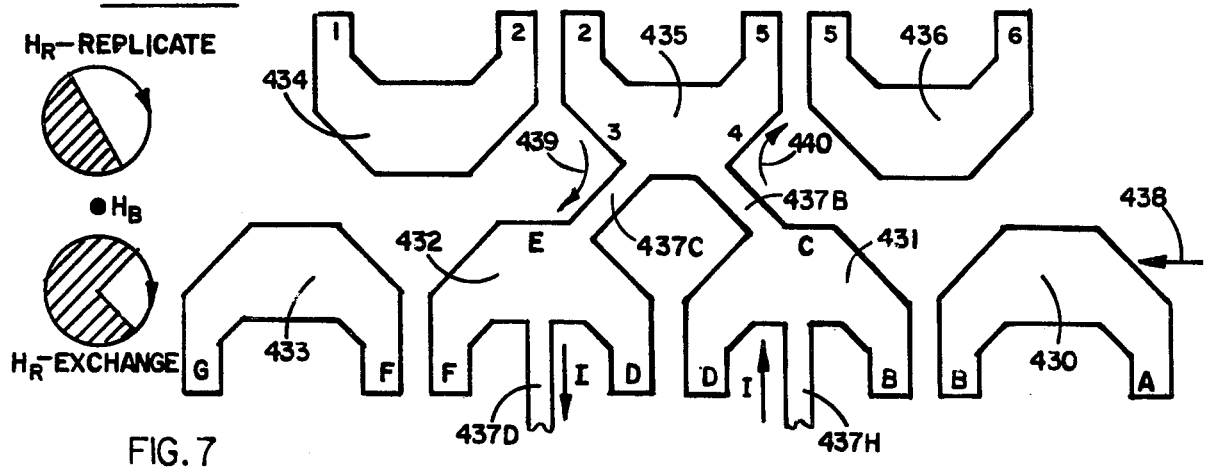

Referring now to FIG. 7, there is shown still another embodiment of a one level transfer/replicate switch utilizing gap tolerant propagation circuit elements. The embodiment shown in FIG. 7, however, has the advantage of permitting the switch current conductor to be returned to the same side of the propagation loops. This advantage is especially desirable in the fabrication of major/minor loop chip organizations. That is, the conductor can be returned to one edge of a chip, for example, and need not be carried through the minor loop arrangement. In order to facilitate the arrangement, element 435 spans the gap between elements 431 and 432. Conductor 437 is interconnected with these elements. In this configuration bubbles propagate through the respective propagation paths in the directions suggested by arrows 438. This propagation occurs in the absence of a switching current signal or conductor 437. Thus, in one path the bubbles propagate through bubble location A, B, C, D, E, F, G and so forth, and through bubble locations 1, 2, 3, 4, 5, 6 in the other path.

If transfer operation is desired, a current signal is applied to conductor 437 which current propagates through the various sections 437A, B, C and D to create a current path and, thus, a magnetic field adjacent the propagation element. In this case, the bubble propagates from bubble location A through B to C. However, the current in conductor segment 437B creates a magnetic field which blocks and deflects the bubble to location 4 in element 435. In response to the rotating field $H_R$ the bubble propagates to locations 5 and 6 in sequence. Similarly, the bubble at location 2 propagates to location 3 and is then blocked and propagated to location E from where it is propagated to locations F, G in sequence.

In the replicate mode, no bubble is propagated in elements 430–433. However, the bubble in the minor loop propagates from location 2 until it is stretched between locations 3 and 4 in typical fashion. At this point, a signal current of appropriate sign and magnitude is applied wherein a portion of the bubble at location 3 is stripped toward location E. Shortly thereafter, a current of appropriate amplitude and polarity is applied to conductor 437 wherein the bubble stretched between locations 4 and E is effectively severed at approximately location 3 so that the bubble at location 4 is free to propagate to location 5 and so forth while the bubble at location E propagates to location F and so forth. There has been shown another transfer/replicate switch using the improved propagation elements in the gap tolerant arrangement shown and described, supra. In addition, this embodiment permits the control conductor to be returned to a given location so that the conductor can begin and terminate at one side of the chip.

Figure 8A:
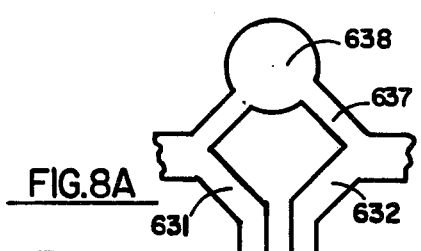
Figure 8:
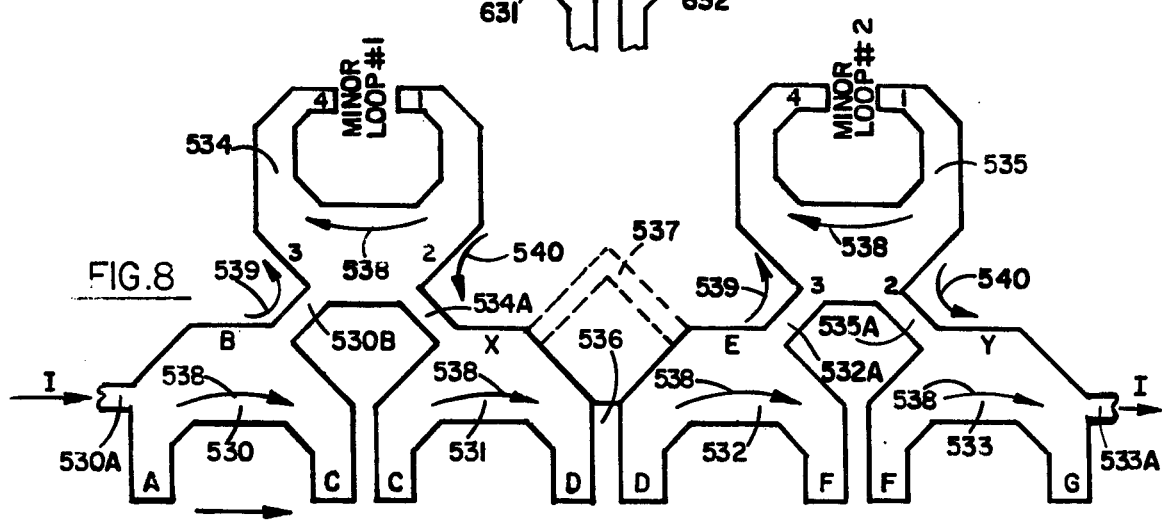

Referring now to FIG. 8, there is shown another embodiment of a major/minor loop configuration. In this configuration, the minor loop is more compact because of the utilization of $3\pi$ elements 534 or 535 as a minor loop component. In addition, in the embodiment shown in FIG. 8 the switching current conductor 530 is connected by short stubs such as 530A and 536 between adjacent propagation elements such as elements 531 and 532. The elements which are connected together by the short current conductor stub, generally, are not connected to the minor loop propagation element. However, the propagation loop elements 534 and 535, for example, in the minor loops are also connected through conductor stubs such as 530B, 534A (or 532A and 535A). Thus, the current signal supplied at stub 530A passes through a portion of propagation element 530, through stub 530B, a portion of element 534, through stub 534A, a portion of element 531, through stub 536 to element 532 and so forth. When the current is applied, a control operation is effected. That is, the bubbles propagating through the system typically follow the path indicated by arrows 538. When a control signal I is applied at conductor 530A, the bubble transfer operations are as suggested by arrows 539 and 540 which are similar to bubble transfers noted above. In some instances, the transfers from one loop to the other will occur simultaneously wherein the transfer is in effect a exchange of bubbles from between loops.

In addition, with no bubbles propagating through the major path comprising elements 530, 531 and the like, bubbles in the minor loops can be replicated in much the same fashion as indicated and discussed relative to FIG. 7. Thus, bubbles stored in a storage loop such as minor loop 1 can be circulated therethrough and replicated as suggested by arrows 540 such that non-destructive readout can occur.

In a modification to the system shown in FIG. 8, the short interelement stubs such as 536 can be replaced by angulated and elongated stubs 537. These stubs effect a somewhat triangular configuration between adjacent propagation elements. This arrangement may be necessary and desirable in some instances in order to preclude the magnetic field produced by the current through this interelement stub from affecting the bubble domain propagation.

Referring now to FIG. 8A, there is shown another modification of the embodiment shown in FIG. 8 . In FIG. 8A, stub 536 is omitted and stub 637 (which is equivalent to stub 537) is provided. However, the disk 638 is provided at the apex of the stub. Disk 638 may be utilized to provide an idler location for certain bubble propagation patterns desired and may be used in connection with data reordering in the minor loops since information may be exchanged with the disk just as in connection with the previously described switches. The transfer or exchange operation is identical to that described in connection with FIGS. 6 or 7 except that element 435 or 534 is replaced by an idler disk.

Thus, there have been shown and described improved, unique gap tolerant propagation element structures. The propagation structures permit portions of adjacent elements to be disposed in parallel such that the magnetic poles of these elements are supportive rather than repulsive. Thus, the interelement gap tolerance of the system is greatly increased. In addition, various applications and utilizations of the elements are noted and described. It is submitted that those skilled in the art may contemplate other modifications of the basic concept. However, any such applications and utilizations which fall within the above description are intended to be included within the purview of this invention. The illustrative embodiments are not intended to be limitative of the invention. Rather, the scope of the invention is to be determined only by the claims appended hereto.

Having thus described a preferred embodiment of the invention, what is claimed is:

1. A magnetic bubble domain propagation structure comprising
a substantially symmetrical device capable of establishing magnetic poles,
said device comprising
a base portion, and
at least two end portions,
said base portion has elongated opposed sides which are substantially parallel to each other whereby said base portion has a substantially rectangular configuration,
said base portion has greater length between said end portions than width between said elongated, opposed sides,
said end portions connected to opposite ends of said base portion and extending therefrom at an angle to permit similar end portions of adjacent devices to be aligned in parallel therewith.

2. The structure recited in claim 1 wherein
said angle between said end portions and said base portion is approximately 135°.

3. The structure recited in claim 1 wherein
said end portions are narrower than said base portion.

4. The structure recited in claim 1 including
at least two coupling portions,
said coupling portions connected between said base portion and said end portions.

5. The structure recited in claim 4 wherein
said end portions and said coupling portions are arranged relative to said base portion such that said end portions are substantially parallel to each other.

6. The structure recited in claim 5 wherein
said device has a U-shaped configuration.

7. The structure recited in claim 4 wherein
said end portions and said coupling portions are arranged relative to said base portion such that said end portions are substantially parallel to said base portion and extend toward each other.

8. The structure recited in claim 7 wherein
said base portion is of substantially the same width as said end portions.

9. The structure recited in claim 7 wherein
said device has a C-shaped configuration.

10. The structure recited in claim 7 wherein
said end portions extend toward each other substantially colinearly.

11. A magnetic bubble domain propatation structure comprising
a plurality of devices capable of establishing magnetic poles therein,
each of said devices comprising
a base portion, and
at least two end portions,
said base portion has elongated opposed sides which are substantially parallel to each other whereby said base portion has a substantially rectangular configuration,
said end portions of each device connected to opposite ends of said base portion of the respective devices and extending therefrom at any angle,
said plurality of devices arranged in side-by-side alignment to permit end portions of adjacent ones of said plurality of devices to be aligned in parallel whereby said parallel end portions of adjacent devices form a similar magnetic pole in response to an applied magnetic field.

12. The structure recited in claim 11 wherein at least some of said plurality of devices include coupling portions connected between said base portion and said end portions.

13. The structure recited in claim 12 wherein said plurality of devices are arranged in a major/minor loop configuration.

14. The structure recited in claim 11 including electrical conductor means associated with at least some of said plurality of devices to cause magnetic bubble domains to transfer from one device to another device in response to the application of a control signal to said electrical conductor means.

15. The structure recited in claim 14 wherein said electrical conductor means includes at least some of said devices which are interconnected by electrically conductive strips in a one-level device.

16. The structure recited in claim 15 including at least one idler position connected to an electrically conductive strip between adjacent devices.

17. The structure recited in claim 16 wherein said idler position includes an enlarged area around which a bubble domain can rotate.

18. The structure recited in claim 11 wherein a first set of said plurality of devices has the end portions thereof aligned in parallel to form compound magnetic poles in a first propagation path, and a second set of said plurality of devices has the end portions thereof aligned in parallel to form compound magnetic poles in a second propagation path.

19. The structure recited in claim 18 wherein at least one of said devices includes coupling portions connected between said base portion and said end portions, said at least one of said devices forming a member in one of said propagation paths to provide a looped path.

20. The structure recited in claim 18 wherein said first set of said plurality of devices comprises devices arranged adjacent to each other.

said second set of said plurality of devices includes at least one device which spans the space between adjacent devices in said first set, and conductor means arranged for magnetic interaction between said at least one device in said second set of devices and the adjacent devices in said first set of devices which define the space spanned by said at least one device.

21. The structure recited in claim 20 wherein, said first and second sets of devices comprise a plurality of U-shaped devices and said at least one device comprises a C-shaped device.

* * * * *